(12) United States Patent
Takeda et al.

(10) Patent No.: US 7,977,027 B2
(45) Date of Patent: *Jul. 12, 2011

(54) RESIST COMPOSITION AND PATTERNING PROCESS

(75) Inventors: Takanobu Takeda, Joetsu (JP); Osamu Watanabe, Joetsu (JP); Satoshi Watanabe, Joetsu (JP); Youichi Ohsawa, Joetsu (JP); Ryuji Koitabashi, Joetsu (JP); Tamotsu Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 768 days.

This patent is subject to a terminal disclaimer.

(21) Appl. No.: 11/876,298

(22) Filed: Oct. 22, 2007

(65) Prior Publication Data

US 2008/0096128 A1 Apr. 24, 2008

(30) Foreign Application Priority Data

Oct. 20, 2006 (JP) ................................. 2006-285753

(51) Int. Cl.
*G03F 7/039* (2006.01)
*G03F 7/26* (2006.01)

(52) U.S. Cl. ..................... 430/270.1; 430/322; 430/326

(58) Field of Classification Search ............... 430/270.1, 430/326, 322; 564/297
See application file for complete search history.

(56) References Cited

U.S. PATENT DOCUMENTS

| | | | |
|---|---|---|---|
| 4,279,993 A * | 7/1981 | Magers et al. .................. 435/14 |
| 4,491,628 A | 1/1985 | Ito et al. |
| 4,511,641 A * | 4/1985 | Busman et al. ............... 430/158 |
| 5,310,619 A | 5/1994 | Crivello et al. |
| 5,525,453 A | 6/1996 | Przybilla et al. |
| 5,529,886 A | 6/1996 | Eichhorn et al. |
| 5,576,143 A | 11/1996 | Aoai et al. |
| 5,580,695 A | 12/1996 | Murata et al. |
| 5,612,169 A | 3/1997 | Eichhorn et al. |
| 5,639,880 A * | 6/1997 | Muller et al. .................. 544/173 |
| 5,691,100 A | 11/1997 | Kudo et al. |
| 5,714,625 A | 2/1998 | Hada et al. |
| 5,744,281 A | 4/1998 | Niki et al. |
| 5,843,319 A | 12/1998 | Przybilla et al. |
| 6,004,724 A | 12/1999 | Yamato et al. |
| 6,063,953 A | 5/2000 | Hada et al. |
| 6,080,714 A * | 6/2000 | Overkempe et al. .......... 510/433 |
| 6,261,738 B1 | 7/2001 | Asakura et al. |
| 6,512,020 B1 | 1/2003 | Asakura et al. |
| 6,703,181 B1 | 3/2004 | Hayashi et al. |
| 6,887,646 B1 * | 5/2005 | Fujiwara et al. ............ 430/270.1 |
| 7,166,414 B2 | 1/2007 | Thackeray et al. |
| 2002/0061463 A1 * | 5/2002 | Nishi et al. ................. 430/270.1 |
| 2004/0106063 A1 * | 6/2004 | Hatakeyama et al. ..... 430/270.1 |
| 2005/0014092 A1 * | 1/2005 | Hasegawa et al. ......... 430/270.1 |
| 2005/0244746 A1 * | 11/2005 | Makino et al. ............. 430/270.1 |
| 2009/0004608 A1 * | 1/2009 | Sawada et al. ................ 430/325 |
| 2010/0009299 A1 * | 1/2010 | Watanabe et al. ............. 430/326 |

FOREIGN PATENT DOCUMENTS

| | | |
|---|---|---|
| JP | 63-27829 A | 2/1988 |
| JP | 63-27829 A | 1/1990 |
| JP | 5-159239 A | 6/1993 |
| JP | 5-232706 A | 9/1993 |
| JP | 5-249662 A | 9/1993 |
| JP | 5-249683 A | 9/1993 |
| JP | 5-257282 A | 10/1993 |
| JP | 5-289322 A | 11/1993 |
| JP | 5-289340 A | 11/1993 |
| JP | 6-194834 A | 7/1994 |
| JP | 6-242605 A | 9/1994 |
| JP | 6-242606 A | 9/1994 |
| JP | 6-263716 A | 9/1994 |
| JP | 6-263717 A | 9/1994 |
| JP | 6-266100 A | 9/1994 |
| JP | 6-266111 A | 9/1994 |
| JP | 7-92678 A | 4/1995 |
| JP | 7-92680 A | 4/1995 |
| JP | 7-92681 A | 4/1995 |
| JP | 7-120929 A | 5/1995 |
| JP | 7-128859 A | 5/1995 |
| JP | 7-134419 A | 5/1995 |
| JP | 9-95479 A | 4/1997 |
| JP | 9-280554 A | 8/1997 |
| JP | 9-230588 A | 9/1997 |
| JP | 2000-275836 A | 10/2000 |
| JP | 2000-314956 A | 11/2000 |
| JP | 2002-328471 A | 11/2002 |
| JP | 2005-154386 A | 6/2005 |
| WO | WO 2007/080726 | * 7/2007 |

OTHER PUBLICATIONS

W. Hinsberg et al.; "Fundamental Studies of Airborne Chemical Contamination of Chemically Amplified Resists"; Journal of Photopolymer Science and Technology, vol. 6, No. 4, pp. 535-546, 1993.

T. Kumada et al.; "Study on Over-Top Coating of Positive Chemical Amplification Resists for KrF Excimer Laser Lithography"; Journal of Photopolymer Science and Technology, vol. 6, No. 4, pp. 571-574, 1993.

J. Hatakeyama et al.; "Investigation of Discrimination Enhancement with New Modeling for Poly-Hydroxystyrene Positive Resists"; Journal of Photopolymer Science and Technology, vol. 13, No. 4, pp. 519-524, 2000.

Japanese Office Action dated Dec. 15, 2010, issued in corresponding Japanese Patent Application No. 2006-285753.

* cited by examiner

*Primary Examiner* — Cynthia H Kelly
*Assistant Examiner* — Anca Eoff
(74) *Attorney, Agent, or Firm* — Westerman, Hattori, Daniels & Adrian, LLP

(57) ABSTRACT

A chemically amplified positive resist composition comprises a compound having an amine oxide structure as a basic component, a base resin, a photoacid generator, and an organic solvent. The resist composition exhibits a high resolution, significantly prevents a line pattern from collapsing after development, and has improved etch resistance.

3 Claims, 1 Drawing Sheet

RESIST COMPOSITION AND PATTERNING PROCESS

CROSS-REFERENCE TO RELATED APPLICATION

This non-provisional application claims priority under 35 U.S.C. §119(a) on Patent Application No. 2006-285753 filed in Japan on Oct. 20, 2006, the entire contents of which are hereby incorporated by reference.

TECHNICAL FIELD

The present invention relates to a resist composition, and specifically a chemically amplified positive resist composition, comprising a compound having an amine oxide structure and suitable for microfabrication technology, and a patterning process using the same.

BACKGROUND ART

Of the efforts currently being made to achieve a finer pattern rule in the drive for higher integration and operating speeds in LSI devices, deep-ultraviolet lithography is thought to hold particular promise as the next generation in microfabrication technology. Deep-UV lithography is capable of fabrication to dimensions of 0.2 µm or less and, when a resist having low light absorption is used, can form patterns with sidewalls that are nearly perpendicular to the substrate. One technology that has attracted a good deal of attention recently utilizes high-intensity KrF and ArF excimer lasers as the deep-UV light source. This technology is being used in large-volume production, prompting a desire for resists having a low light absorption and a high sensitivity.

Acid-catalyzed, positive-working chemical amplification resists (e.g., U.S. Pat. No. 4,491,628 and U.S. Pat. No. 5,310,619, or JP-B 2-27660 and JP-A 63-27829) developed in response to the above needs are endowed with excellent properties, including a high sensitivity, high resolution and good dry-etching resistance, which make them especially promising as resists for deep-UV lithography.

However, one problem with chemically amplified resist materials is that, when the standing time from exposure to post exposure bake (PEB) is long, the line pattern formed during patterning acquires a "T-top" shape characterized by widening at the top of the pattern. This defect is called "post exposure delay" (PED). Another problem with such resists is "footing," which is a widening of the resist pattern close to the substrate that occurs on a basic substrate, particularly a silicon nitride or titanium nitride substrate. The T-top effect is believed to result from a decrease in solubility at the surface of the resist film, and the footing effect at the substrate surface appears to arise from a decline in solubility near the substrate. An additional problem is that elimination of acid labile groups, which is a dark reaction, proceeds for the duration between the exposure step and the PEB step, reducing the final dimensions of the pattern lines. These problems represent major drawbacks to the practical use of chemically amplified resists. Because of such drawbacks, prior-art positive chemically amplified resists are difficult to dimensionally control in the lithographic process, and dimensional control is also lost during dry etching of the substrate (see, for example, W. Hinsberg et al., Journal of Photopolymer Science and Technology, Vol. 6, No. 4, 535-546 (1993); and T. Kumada et al., ibid., 571-574).

In positive chemically amplified resists, the problems of PED and footing on the substrate surface are believed to be caused in large part by basic compounds which are either airborne or present on the surface of the substrate. The acid at the surface of the resist film that has been generated by exposure reacts with airborne bases and is deactivated. Prolonged standing until post-exposure bake results in a corresponding increase in the amount of deactivated acid, making it more difficult for the acid-labile groups to decompose. A substantially insolubilized layer thus forms at the surface, giving the resist pattern a T-top shape.

It is well-known in the art that the addition of a nitrogen-containing compound can check the influence of airborne bases, and is thus effective also against PED (see, for example, JP-A 5-232706, JP-A 5-249683, JP-A 5-158239, JP-A 5-249662, JP-A 5-257282, JP-A 5-289322, JP-A 5-289340, JP-A 6-194834, JP-A 6-242605. JP-A 6-242606, JP-A 6-263716, JP-A 6-263717, JP-A 6-266100, JP-A 6-266111, JP-A 7-128859, JP-A 7-92678, JP-A 7-92680, JP-A 7-92681, JP-A 7-120929 and JP-A 7-134419). Familiar nitrogen-containing compounds having significant addition effects include amine compounds and amide compounds. Specific examples include pyridine, polyvinylpyridine, aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N-dimethylacetamide, 2-pyrrolidone, N-methylpyrrolidone, imidazole, α-picoline, β-picoline, γ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol, and 2-(p-chlorophenyl)-4,6-trichloromethyl-S-triazine.

These nitrogen-containing compounds are weak bases and can alleviate the T-top problem, but such compounds are unable to control the reaction when highly reactive acid-labile groups are used; that is, they cannot control acid diffusion fully. With the addition of a weak base, the dark reactions in PED in particular proceed in unexposed areas, causing slimming of the line dimensions and a loss of film thickness from the line surface during PED. To overcome Such problems, it is desirable to add a strong base. However, a higher basicity is not necessarily better. For example, good effects cannot be obtained with the addition of the following super-strong bases; DBU (1,8-diazabicylo[5.4.0]-7-undecene), DBN (1,5-diazabicyclo[4.3.0]-5-nonene) and proton sponge (1,8-bis(dimethylamino)naphthalene) or quaternary ammonium hydroxides such as tetramethylammonium hydroxide.

The addition of a nitrogen-containing compound having an excellent generated acid make-up effect works well to increase the contrast and thereby achieve a high resolution. Although the dissociation constants of the acid and base within water can be explained in terms of pKa, the acid make-up ability within the resist film is not directly related to the pKa of the nitrogen-containing compound. This is discussed by Hatakeyama et al. In Journal of Photopolymer Science and Technology, Vol. 13, No. 4, pp. 519-524 (2000). It is also known that the profile of a pattern is largely dictated by the identity of a nitrogen-containing compound used.

SUMMARY OF THE INVENTION

An object of the invention is to provide a resist composition, and specifically a chemically amplified resist composition, which exhibits a high resolution and forms a precisely configured pattern, when processed by photolithography for micropatterning, especially lithography using a light source such as a KrF laser, ArF laser, $F_2$ laser, extremely short UV, electron beam or x-ray. Another object of the invention is to provide a patterning process which uses the resist composition.

The inventors have found that when a compound having an amine oxide structure is added as a basic component to a resist composition, the resulting resist composition forms a resist film which exhibits a high resolution, substantially prevents a line pattern from collapsing after development, and has improved etch resistance inherent to the pattern profile.

In a first aspect, the invention provides a resist composition comprising (A) at least one compound having an amine oxide structure as a basic component, and more specifically, a chemically amplified positive resist composition comprising (A) a compound having an amine oxide structure as a basic component, (B) an organic solvent, (C) a base resin having an acid labile group-protected acidic functional group which is alkali-insoluble or substantially alkali-insoluble, but becomes alkali-soluble when the acid labile group is eliminated, and (D) a photoacid generator.

In one embodiment, component (A) comprises at least one compound having an amine oxide structure represented by the general formula (1):

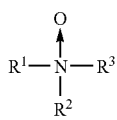

(1)

wherein $R^1$, $R^2$, and $R^3$ are each independently selected from the group consisting of hydrogen, straight, branched or cyclic $C_1$-$C_{20}$ alkyl, $C_6$-$C_{20}$ aryl, $C_7$-$C_{20}$ aralkyl, $C_1$-$C_{10}$ hydroxyalkyl, $C_2$-$C_{10}$ alkoxyalkyl, $C_2$-$C_{10}$ acyloxyalkyl, and $C_2$-$C_{10}$ alkylthioalkyl groups, and any two of $R^1$, $R^2$, and $R^3$ may bond together to form a cyclic structure or aromatic ring.

In another embodiment, component (A) comprises at least one compound having an amine oxide structure represented by the general formula (2):

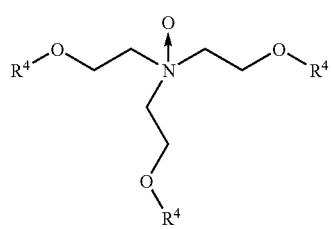

(2)

wherein $R^4$ is selected from the group consisting of hydrogen, straight, branched or cyclic $C_1$-$C_{20}$ alkyl, $C_6$-$C_{20}$ aryl, $C_7$-$C_{20}$ aralkyl, $C_2$-$C_{10}$ alkoxyalkyl, $C_1$-$C_{10}$ hydroxyalkyl, and $C_2$-$C_{10}$ acyloxyalkyl groups.

In a further embodiment, component (A) comprises a compound having an amine oxide structure represented by the formula (3):

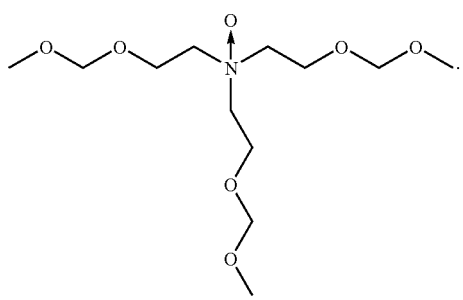

(3)

In a still further embodiment, component (A) comprises at least one compound having an amine oxide structure represented by the general formula (4):

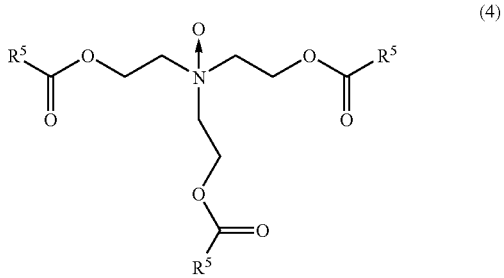

(4)

wherein $R^5$ is hydrogen, straight, branched or cyclic $C_1$-$C_{20}$ alkyl, $C_6$-$C_{20}$ aryl, or $C_7$-$C_{20}$ aralkyl group.

In a second aspect, the invention provides a patterning process comprising the steps of (1) applying the resist composition defined above onto a substrate or mask blank substrate to form a coating; (2) heat treating the coating, then exposing it to high-energy radiation, EUV or electron beam through a photomask; and (3) optionally heat treating the exposed coating, then developing with a developer.

BENEFITS OF THE INVENTION

Since a compound having an amine oxide structure is compounded as a basic component in a resist composition, the resulting resist composition exhibits a high resolution, significantly prevents a line pattern from collapsing after development (pattern collapse is otherwise caused by defective pattern profile), and has improved etch resistance inherent to the pattern profile. The amine oxide structure compound exerts best effects when compounded in resists, making the resists ideal as a micropatterning material for the fabrication of VLSI and photomasks.

DESCRIPTION OF THE PREFERRED EMBODIMENTS

Figure 1:
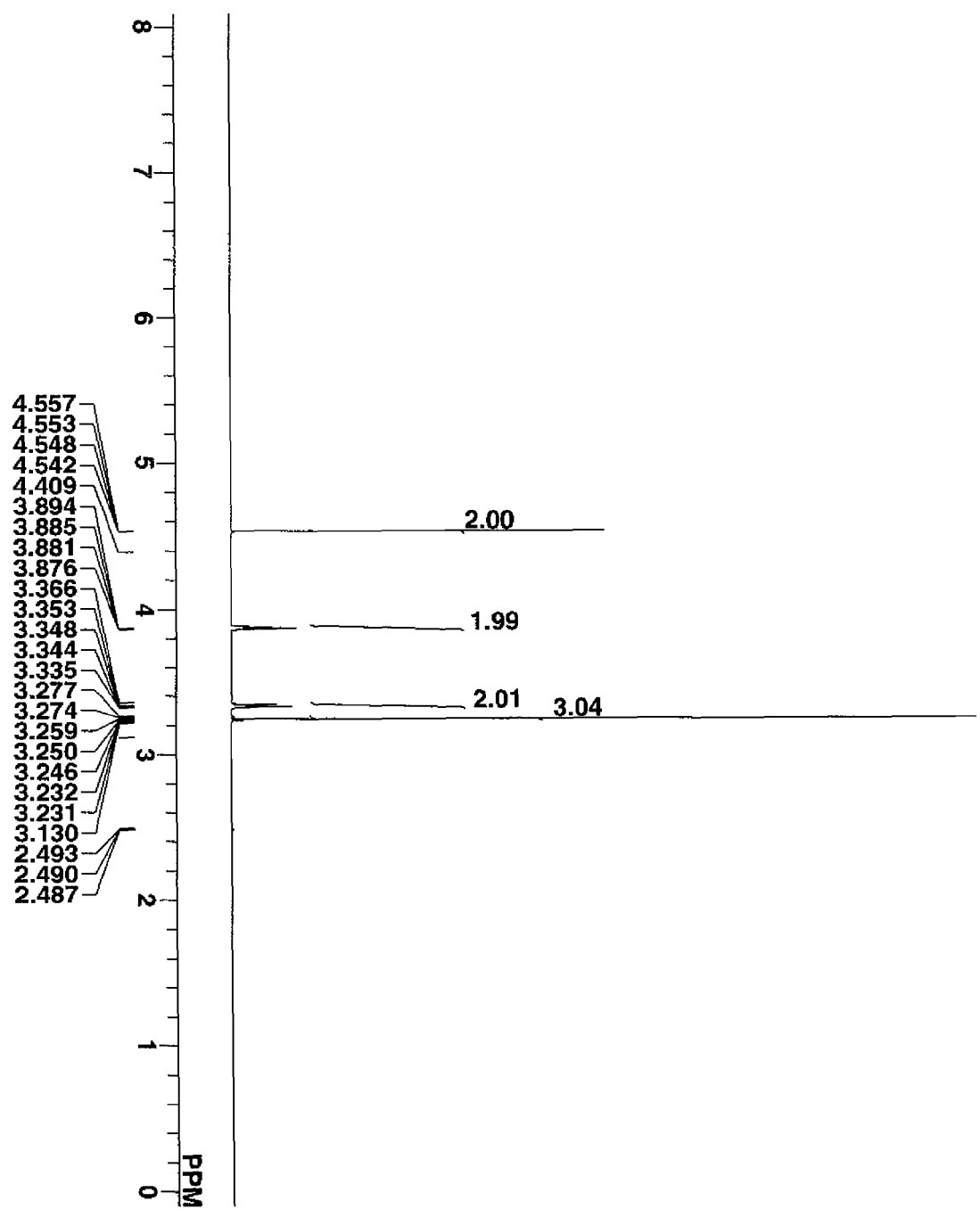
FIG. 1 is a diagram of $^1$H-NMR of the compound obtained in Synthesis Example 1.

The terms "a" and "an" herein do not denote a limitation of quantity, but rather denote the presence of at least one of the referenced item.

As used herein, the notation ($C_n$-$C_m$) means a group containing from n to m carbon atoms per group.

It would be desirable to have a compound which provides a high resolution and a good pattern profile when compounded in a resist composition. The inventors have found that when a compound having an amine oxide structure is added to a chemically amplified photoresist composition, the resulting resist composition forms a resist film which exhibits a high resolution and has a good pattern profile. Among others, those compounds having an amine oxide structure represented by formulae (1) to (4) can be readily prepared in high yields, and are very effective when compounded in resist compositions. Particularly when a resist film is exposed to electron bean, optionally heat treated, and developed with a developer, prior art resist compositions are defective in pattern profile, specifically of an isolated line pattern. Although the pattern itself can be resolved, the pattern collapses due to detective pattern profile after development so that the results are substantially meaningless. The use of the resist composition of the invention overcomes these drawbacks and achieves improvements of significance.

The nitrogen-containing compounds to be compounded in the resist composition are preferably compounds having an amine oxide structure, represented by the general formulae (1) to (4) below. The organic nitrogen-containing compounds are not limited to these, as long as they are of the structure having a nitrogen atom oxidized. In addition to the compounds having an amine oxide structure, any of ordinary organic nitrogen-containing compounds which are not oxidized may be compounded.

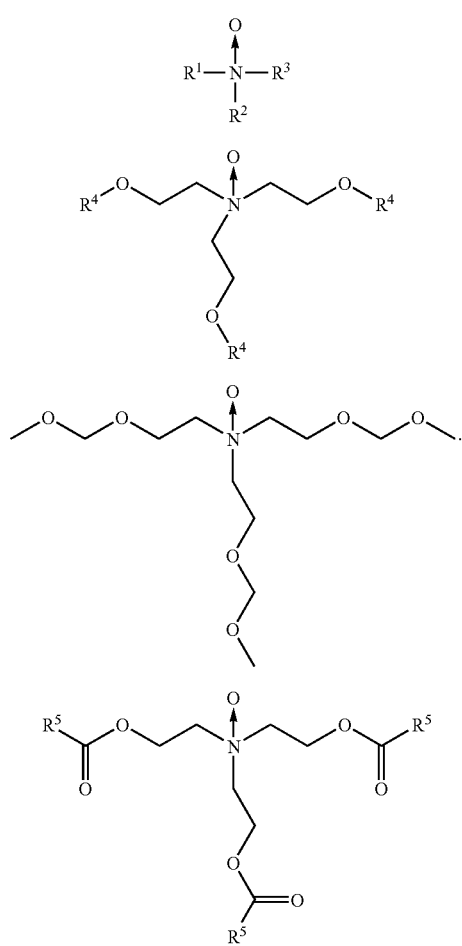

Herein $R^1$, $R^2$, and $R^3$ are each independently selected from among hydrogen, straight, branched or cyclic $C_1$-$C_{20}$ alkyl, $C_6$-$C_{20}$ aryl, $C_7$-$C_{20}$ aralkyl, $C_1$-$C_{10}$ hydroxyalkyl, $C_2$-$C_{10}$ alkoxyalkyl, $C_2$-$C_{10}$ acyloxyalkyl, and $C_2$-$C_{10}$ alkylthioalkyl groups, and any two of $R^1$, $R^2$, and $R^3$ may bond together to form a cyclic structure or aromatic ring. $R^4$ is hydrogen, or a straight, branched or cyclic $C_1$-$C_{20}$ alkyl, $C_6$-$C_{20}$ aryl, $C_7$-$C_{20}$ aralkyl, $C_2$-$C_{10}$ alkoxyalkyl, $C_1$-$C_{10}$ hydroxyalkyl, or $C_2$-$C_{10}$ acyloxyalkyl group. $R^5$ is hydrogen, or a straight, branched or cyclic $C_1$-$C_{20}$ alkyl, $C_6$-$C_{20}$ aryl, or $C_7$-$C_{20}$ aralkyl group.

Examples of $C_6$-$C_{20}$ aryl include phenyl, naphthyl, anthryl, phenanthryl, pyrenyl, naphthacenyl, and fluorenyl. Examples of straight, branched or cyclic $C_1$-$C_{20}$ alkyl include methyl, ethyl, propyl, isopropyl, butyl, isobutyl, t-butyl, pentyl, hexyl, decyl, cyclopentyl, cyclohexyl, and dedahydronaphthalenyl. Examples of $C_7$-$C_{20}$ aralkyl include benzyl, phenethyl, phenylpropyl, naphthylmethyl, naphthylethyl, and anthracenylmethyl. Examples of $C_1$-$C_{10}$ hydroxyalkyl include hydroxymethyl, hydroxyethyl and hydroxypropyl. Examples of $C_2$-$C_{10}$ alkoxyalkyl include methoxymethyl, ethoxymethyl, propoxymethyl, isopropoxymethyl, butoxyethyl, isobutoxymethyl, t-butoxymethyl, t-amyloxymethyl, cyclohexyloxymethyl, and cyclopentyloxymethyl. Examples of $C_2$-$C_{10}$ acyloxyalkyl include formyloxymethyl, acetoxymethyl, propionyloxymethyl, butyryloxymethyl, pivaloyloxymethyl, cyclohexanecarbonyloxymethyl, and decanoyloxymethyl. Examples of $C_2$-$C_{10}$ alkylthioalkyl include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl. All these examples are for illustration only and not intended for limitation.

Illustrative, non-limiting examples of the compound having an amine oxide structure represented by formula (1) are given below.

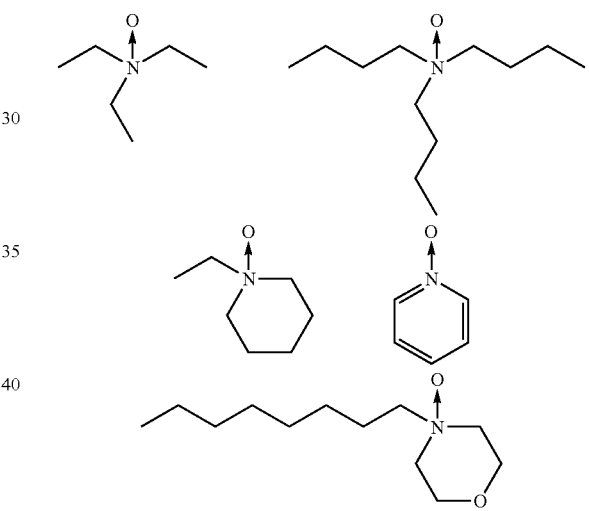

Illustrative, non-limiting examples of the compound having an amine oxide structure represented by formulae (2) and (4) are given below.

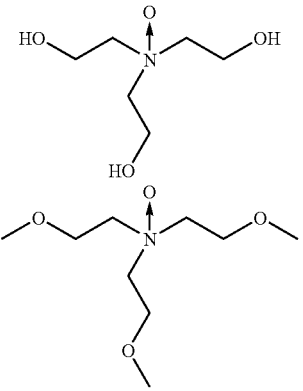

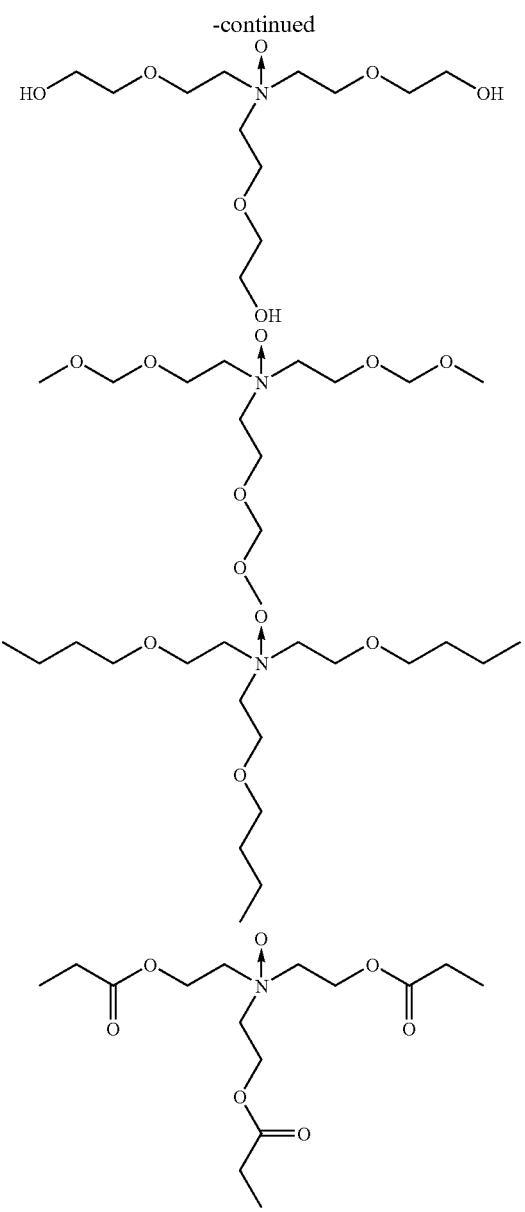

It is believed that the organic nitrogen-containing compound having an amine oxide structure within the molecule functions such that the presence of a substituted functional group on the nitrogen atom provides for quick make-up of the acid generated whereas the structure having a nitrogen atom oxidized affects the distribution in a resist film. As a result of these functions, a photoresist having added thereto a compound having an amine oxide structure acquires a high resolution and an improved pattern profile. A proper choice may be made among the compounds having an amine oxide structure. That is, an amine oxide structure compound having an appropriate volatility, basicity, acid make-up rate and/or diffusion rate in resist may be chosen in accordance with a particular combination of a resist polymer and an acid generator. In summary, an amine oxide structure compound additive is chosen so as to formulate a resist composition having properly adjusted properties including pattern profile.

Among the compounds having an amine oxide structure represented by formulae (1) to (4), some are existing and some are novel. The compound having an amine oxide structure can be prepared by an optimum method selected in accordance with its structure. Exemplary methods include, but are not limited to, an oxidative reaction of a nitrogen-containing compound using an oxidizing agent, and an oxidative reaction of a nitrogen-containing compound in an aqueous hydrogen peroxide diluted solution. The preparation methods are described in detail.

A first method is an esterification reaction of a nitrogen-containing alcohol compound according to an exemplary scheme shown below. This method is applicable to the synthesis of all compounds having formulae (1) to (4).

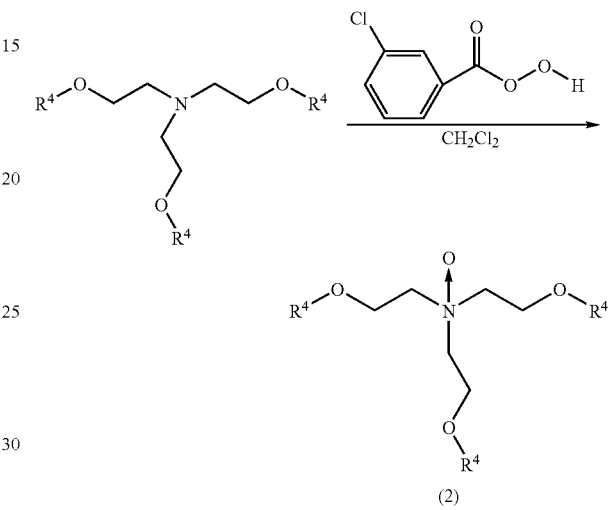

Herein $R^4$ is as defined above.

As shown in the scheme, this reaction is an oxidative reaction of an amine using an oxidizing agent, m-chloroperbenzoic acid. The reaction may also be effected using other oxidizing agents employed in ordinary oxidative reactions. Following the reaction, the reaction mixture may be purified by an ordinary technique such as distillation, chromatography or recrystallization.

A second method is an oxidative reaction of an amine in a solvent as used for the resist composition according to an exemplary scheme shown below. This method is applicable to the synthesis of all compounds having formulae (1) to (4).

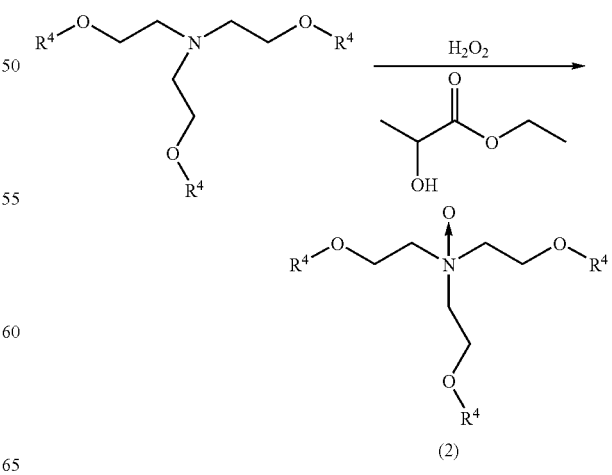

Herein $R^4$ is as defined above.

As shown in the scheme, this reaction is an oxidative reaction using aqueous hydrogen peroxide as the oxidizing agent. The oxidative reaction is effected in the solvent used for resists, and following the reaction, the reaction mixture may be compounded directly in a resist solution. Alternatively, it may be purified by an ordinary technique such as chromatography or recrystallization like the first method.

The compound having an amine oxide structure according to the invention is used to formulate a resist composition as mentioned above. The chemically amplified resist composition may be either positive or negative. Typically it is a chemically amplified positive resist composition comprising (A) a compound having an amine oxide structure as defined above,
(B) an organic solvent,
(C) a base resin having an acid labile group-protected acidic functional group which is alkali-insoluble or substantially alkali-insoluble, but becomes alkali-soluble when the acid labile group is eliminated, and
(D) a photoacid generator.

In the inventive resist composition, an appropriate amount of component (A) compounded is 0.01 to 2 parts by weight, desirably 0.01 to 1 part by weight per 100 parts by weight of the base resin (c). Outside the range, less amounts of component (A) may fail to achieve the desired effect whereas larger amounts may lower the sensitivity of the resist.

Organic solvent B

The organic solvent used herein may be any organic solvent in which the base resin, photoacid generator, and other components are soluble. Illustrative, non-limiting, examples of the organic solvent include ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the photoacid generator is most soluble therein.

An appropriate amount of the organic solvent used is about 200 to 1,000 parts, especially about 400 to 800 parts by weight per 100 parts by weight of the base resin.

Base Resin C

The base resins or polymers used as component (C) in the inventive resist compositions include polyhydroxystyrene (PHS), and copolymers of hydroxystyrene with styrene, (meth)acrylic acid esters or other polymerizable olefinic compounds, for KrF excimer laser resist use; (meth)acrylic acid ester polymers, alternating copolymers of cycloolefin with maleic anhydride, copolymers further containing vinyl ethers or (meth)acrylic acid esters, polynorbornene, and ring-opening metathesis polymerized cycloolefins, for ArF excimer laser resist use; and fluorinated forms of the foregoing polymers (for both KrF and ArF laser uses) and polymers resulting from ring-closure polymerization using fluorinated dienes for F$_2$ laser resist use. Silicon-substituted forms of the foregoing polymers and polysilsesquioxane polymers are useful for the bilayer resists. The base resin is not limited to the polymers of these systems. The base polymers may be used alone or in admixture of two or more. In the case of positive resist compositions, it is a common practice to substitute acid labile groups for hydroxyl groups on phenol, carboxyl groups or fluorinated alkyl alcohols for reducing the rate of dissolution in unexposed regions.

The acid labile groups to be introduced into the base polymers may be selected from a variety of such groups, preferably from acetal groups of 2 to 30 carbon atoms and tertiary alkyl groups of 4 to 30 carbon atoms having the formulae (C1) and (C2), respectively.

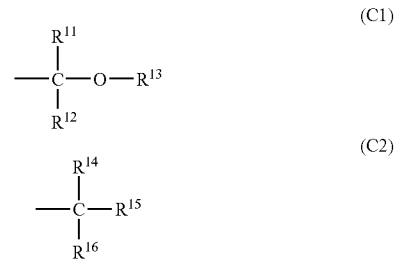

In formulae (C1) and (C2), $R^{11}$ and $R^{12}$ each are hydrogen or a straight, branched or cyclic alkyl group of 1 to 20 carbon atoms, preferably 1 to 12 carbon atoms, which may contain a hetero atom such as oxygen, sulfur, nitrogen or fluorine, $R^{13}$, $R^{14}$, $R^{15}$ and $R^{16}$ each are a straight, branched or cyclic alkyl group of 1 to 20 carbon atoms, preferably 1 to 12 carbon atoms, an aryl group or an aralkyl group, which may contain a hetero atom such as oxygen, sulfur, nitrogen or fluorine. A pair of $R^{11}$ and $R^{12}$, a pair of $R^{11}$ and $R^{13}$, a pair of $R^{12}$ and $R^{13}$, a pair of $R^{14}$ and $R^{15}$, a pair of $R^{14}$ and $R^{16}$, or a pair of $R^{15}$ and $R^{16}$, taken together, may form a ring of 3 to 20 carbon atoms, preferably 3 to 12 carbon atoms, with the carbon or oxygen atom to which they are attached.

Illustrative examples of the acetal group of formula (C1) include, but are not limited to, methoxymethyl, ethoxymethyl, propoxymethyl, butoxymethyl, isopropoxymethyl, t-butoxymethyl, 1-methoxyethyl, 1-methoxypropyl, 1-methoxybutyl, 1-ethoxyethyl, 1-ethoxypropyl, 1-ethoxybutyl, 1-propoxymethyl, 1-propoxypropyl, 1-propoxybutyl, 1-cyclopentyloxyethyl, 1-cyclohexyloxyethyl, 2-methoxyisopropyl, 2-ethoxyisopropyl, 1-phenoxyethyl, 1-benzyloxyethyl, 1-phenoxypropyl, 1-benzyloxypropyl, 1-adamantyloxyethyl, 1-adamantyloxypropyl, 2-tetrahydrofuryl, 2-tetrahydro-2H-pyranyl, 1-(2-cyclohexanecarbonyloxyethoxy)ethyl, 1-(2-cyclohexanecarbonyloxyethoxy)propyl, 1-[2-(1-adamantylcarbonyloxy)ethoxy]ethyl, and 1-[2-(1-adamantylcarbonyloxy)ethoxy]propyl.

Illustrative examples of the tertiary alkyl group of formula (C2) include, but are not limited to, t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

In the base resin, some hydrogen atoms of hydroxyl groups may be substituted with acid labile groups of the following general formula (C3a) or (C3b) for crosslinkage between molecules or within a molecule.

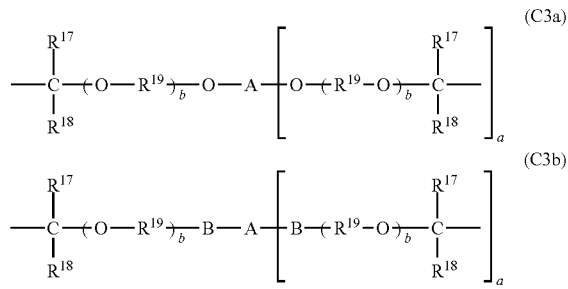

Herein, $R^{17}$ and $R^{18}$ each are hydrogen or a straight, branched or cyclic $C_1$-$C_8$ alkyl group, or $R^{17}$ and $R^{18}$, taken together, may form a ring with the carbon atom to which they are attached, with the proviso that each of $R^{17}$ and $R^{18}$ is a straight or branched $C_1$-$C_8$ alkylene group when they form a ring. $R^{19}$ is a straight, branched or cyclic $C_1$-$C_{10}$ alkylene group. Letter "a" is an integer of 1 to 7, and "b" is 0 or an integer of 1 to 10, "A" is a (a+1)-valent chain-like or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, carbonyl group or fluorine atom. B is —CO—O—, —NHCO—O— or —NHCONH—.

Illustrative examples of the crosslinking acetal linkages represented by formulae (C3a) and (C3b) are given below as (C3)-1 through (C3)-8, but not limited thereto Preferably the base polymer has a weight average molecular weight (Mw) of 2,000 to 100,000, as determined by gel permeation chromatography (GPC) using polystyrene standards. With Mw below 2,000, film formation and resolution may become poor. With Mw beyond 100,000, resolution may become poor or foreign matter may generate during pattern formation.

Photoacid Generator D

The resist composition further contains (D) a compound capable of generating an acid upon exposure to high energy radiation, that is, a photoacid generator. Suitable photoacid generators include sulfonium salts, iodonium salts, sulfonyldiazomethane and N-sulfonyloxyimide photoacid generators. Exemplary photoacid generators are given below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl) sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl) diphenylsulfonium, bis(3,4-di-tert-butoxyphenyl) phenylsulfonium, tris(3,4-di-tert-butoxyphenyl)sulfonyl, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tart-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopenta-

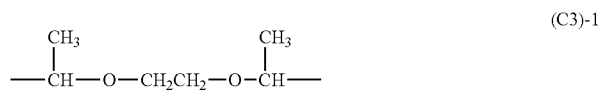

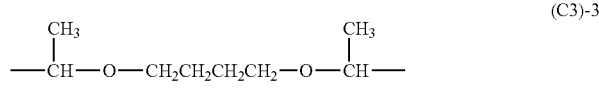

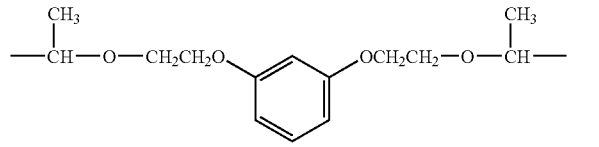

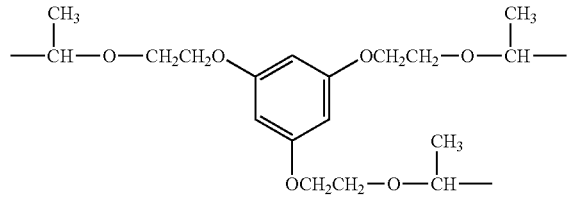

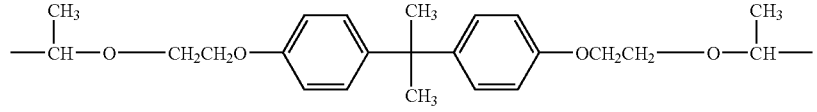

nium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyl)iodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl) diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazonethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Also included are the oxime sulfonates described in U.S. Pat. No. 6,004,724, for example, (5-(4-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc.

Also included are the oxime sulfonates described in U.S. Pat. No. 6,261,738 and JP-A 2000-314956, for example, 2,2, 2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenylethanone oxime-O-(1-naphthylsulfonate); 2,2,2-trifluoro-1-phenylethanone oxime-O-(2-naphthylsulfonate); 2,2,2-trifluoro-1-phenyl-ethanone oxime-O-(2,4,6-trimethylphenylsulfonate), 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oximo-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethyl-phenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethyl-phenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate, 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethyl phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-O-propylsulfonate; 1,3-bis[1-(4-phenoxyphenyl)-2,2,2-trifluoroethanone oxime-O-sulfonyl]phenyl; 2,2,2-trifluoro-1-[4-methylsulfonyloxyphenyl]-ethanone oxime-O-propylsulfonate; 2,2,2-trifluoro-1-[(4-methylcarbonyloxyphenyl]-ethanone oxime-O-propylsulfonate, 2,2,2-trifluoro-1-([6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate, 2,2,2-trifluoro-1-[4-benzyloxyphenyl]-ethanone oxime-O-propylsulfonate; 2,2,2-trifluoro-1-[2-thiophenyl]-ethanone oxime-O-propylsulfonate; and 2,2,2-trifluoro-1-[1-dioxathiophen-2-yl)]-ethanone oxime-O-propylsulfonate.

Also included are the oxime sulfonates described in JP-A 9-95479 and JP-A 9-230588 and the references cited therein, for example, α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl] acetonitrile, α-(tosyloxyimino)-3-thienylacetonitrile, α-(methylsulfonyloxyimino)-1-cyclopentenylacetonitrile, α-(ethylsulfonyloxyamino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacatonitrile.

Suitable bisoxime sulfonates include those described in JP-A 9-208554, for example, bis(α-(4-toluenesulfonyloxy) imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(4-toluenesulfonyloxy) imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(4-toluenesulfonyloxy) imino)-m-phenylenediacetonitrile, bis(α-(benzenesulfonyloxy)imino)-m-phenylenediacetonitrile, bis (α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy)imino)-m-phenylenediacetonitrile, bis(α-(4-methoxybenzenesulfonyloxy)imino)-m-phenylenediacetonitrile, etc.

Of these, preferred photoacid generators are sulfonium salts, bissulfonyldiazomethanes, N-sulfonyloxyimides and glyoxime derivatives. More preferred photoacid generators are sulfonium salts, bissulfonyldiazomethanes, and N-sulfonyloxyimies. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy)benzenesulfonate, tris(4-methylphenyl)sulfonium camphorsulfonate, tris(4-tert-butylphenyl)sulfonium camphorsulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, bis(4-tert-butylphenylsulfonyl)diazomethane, N-camphorsulfonyloxy-5-norbornene-2,3-dicarboxylic acid imide, and N-p-toluenesulfonyloxy-5-norbornene-2,3-dicarboxylic acid imide.

In the resist composition, an appropriate amount of the photoacid generator is, but not limited to, 0.1 to 10 parts, and especially 0.1 to 5 parts by weight per 100 parts by weight of the base resin. Too high a proportion of the photoacid generator may give rise to problems of degraded resolution and foreign matter upon development and resist film peeling. The photoacid generators may be used alone or in admixture of two or more. The transmittance of the resist film can be controlled by using a photoacid generator having a low transmittance at the exposure wavelength and adjusting the amount of the photoacid generator added.

In addition to the compound having an amine oxide structure according to the invention, one or more organic nitrogen-containing compounds which are commonly used in the art may be compounded herein.

If desired, the resist composition may further include well-known additives including dissolution regulators, surfactants, acidic compounds, dyes, thermal crosslinkers, and stabilizers.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171. F172 and F173 (Dainippon Ink & Chemicals, Inc.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, Fluorad FC430. Surflon S-381. Surfynol E1004, KH-20 and KH-30 are preferred. These surfactants may be used alone or in admixture.

In the resist composition of the invention, the surfactant is preferably formulated in an amount of up to 2 parts, and especially up to 1 part by weight, per 100 parts by weight of the base resin.

Pattern formation using the resist composition of the invention may be carried out by a known lithographic technique. For example, the resist composition may be applied onto a substrate such as a silicon wafer by spin coating or the like so as to form a resist film having a thickness of 0.05 to 2.0 µm, which is then pre-baked on a hot plate at 60 to 150° C. for 0.1 to 10 minutes, and preferably at 80 to 140° C. for 0.5 to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$. Light exposure may be done by a conventional exposure process or in some cases, by an immersion process of providing liquid impregnation between the projection lens and the resist. The resist film is then post-exposure baked (PER) on a hot plate at 60 to 150° C. for 0.1 to 5 minutes, and preferably at 80 to 140° C. for 0.5 to 3 minutes. Finally, development may be carried out using as the developer an aqueous alkali solution, such as 0.1 to 5 wt %, and preferably 2 to 3 wt %, tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. If necessary, the pattern as developed can be heat treated for adjusting the pattern size (known as the thermal flow process).

Of the various types of high-energy radiation that may be used, the resist composition of the invention is best suited to micro-pattern formation with, in particular, deep-UV rays having a wavelength of 250 to 120 nm or excimer laser beams, extremely short UV, x-rays or electron beams.

EXAMPLE

Examples of the invention are given below by way of illustration and not by way of limitation.

Synthesis Example 1

Synthesis of tris(2-(methoxymethoxy)ethyl)amine oxide (Quencher 1)

28.1 g (0.1 mole) of tris(2-(methoxymethoxy)ethyl)-amine was dissolved in 85 g of dichloromethane, which was ice cooled. To the solution, 26.5 g (0.1 mole) of 65% pure m-chloroperbenzoic acid in 250 g of dichloromethane was added dropwise at such a rate that the mixture might not exceed 5° C. The mixture was allowed to mature for one hour at room temperature. The reaction solution was concentrated below 30° C. and the residue was purified by column chromatography (basic alumina, elute; dichloromethane/methanol). The eluate was concentrated whereupon the desired compound solidified. The amount was 27.3 g and the yield was 92*.

The compound was analyzed by proton nuclear magnetic resonance spectroscopy ($^1$H-NMR), with the diagram shown in FIG. 1. It was also analyzed by infrared (IR) absorption spectroscopy.

IR (KBr); 3392, 2948, 2892, 2825, 1467, 1444, 1214, 1155, 1110, 1043, 917 cm$^{-1}$

Synthesis Example 2

Synthesis of 2,2',2''-nitrilotriethyl propionate N-oxide (Quencher 2)

30.5 g of 2,2',2''-nitrilotriethyl propionate was dissolved in 85 g of dichloromethane, which was ice cooled. To the solution, 27.1 g of 65% pure m-chloroperbenzoic acid in 250 g of dichloromethane was added dropwise at such a rate that the mixture might not exceed 5° C. The mixture was allowed to mature for one hour at room temperature. The reaction solution was concentrated below 30° C., and the residue was purified by column chromatography (basic alumina, elute: dichloromethane/methanol). The eluate was concentrated whereupon the desired compound solidified. The amount was 24.8 g.

Synthesis Example 3

Synthesis of N-2-((2-methoxyethoxy)methoxy)ethylmorpholine N-oxide (Quencher 3)

16.1 g of N-2-((2-methoxyethoxy)methoxy)ethylmorpholine was dissolved in 85 g of dichloromethane, which was ice cooled. To the solution, 24.9 g of 65% pure m-chloroperbenzoic acid in 250 g of dichloromethane was added dropwise at such a rate that the mixture might not exceed 5° C. The mixture was allowed to mature for one hour at room temperature. The reaction solution was concentrated below 30° C., and the residue was purified by column chromatography (basic alumina, elute: dichloromethane/methanol). The eluate was concentrated whereupon the desired compound solidified. The amount was 15.5 g.

Quenchers 1 to 3 synthesized above have the structural formulae shown below.

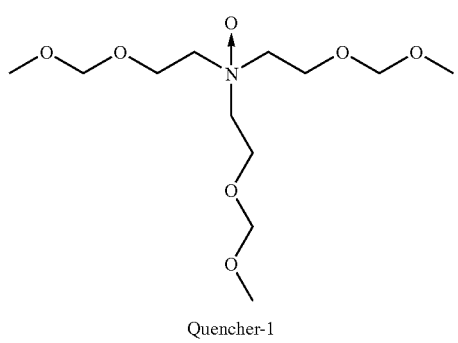

Quencher-1

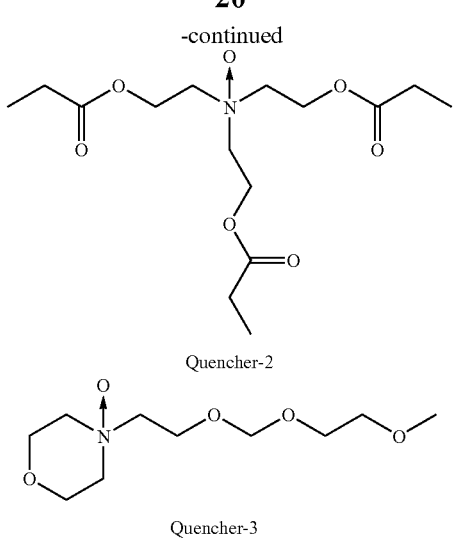

Quencher-2

Quencher-3

Examples and Comparative Examples

Resist compositions were prepared by blending compounds having an amine oxide structure of the invention with other components. They were then evaluated for resolution and pattern profile by carrying out the patterning process of the invention.

The base polymer (Polymers 1 to 3) and photoacid generator (PAG-1, 2) used in Examples are identified below by their structural formula. Weight and number average molecular weights, Mw and Mn, are determined by gel permeation chromatography (GPC) using polystyrene standards.

Base polymer

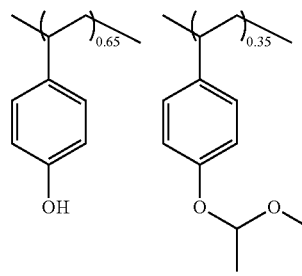

Polymer 1

Mw: 10,000
Mw/Mn: 1.10

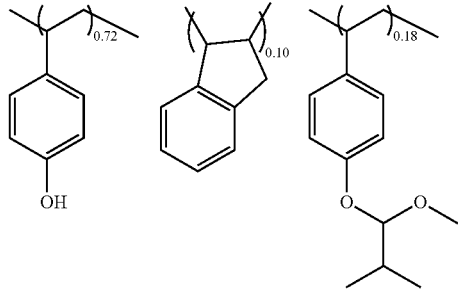

Polymer 2

Mw: 14,000
Mw/Mn: 1.70

-continued

Polymer 3

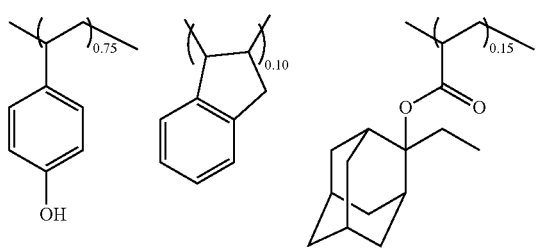

Mw: 8,000
Mw/Mn: 1.80

PAG-1

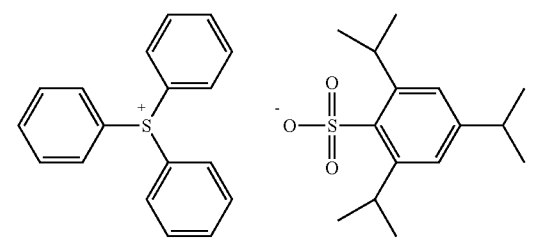

PAG-2

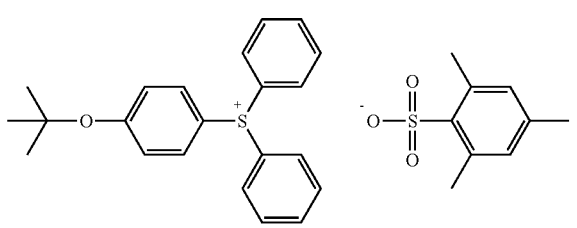

The basic compounds or quenchers used in Examples and Comparative Examples include Quenchers 1 to 3 synthesized above and their precursors prior to oxidative reaction.
Quencher 4: tris(2-(methoxymethoxy)ethyl)amine
Quencher 5: 2,2',2"-nitrilotriethyl propionate
Quencher 6: N-2-((2-methoxyethoxy)methoxy)ethylmorpholine
Surfactant A: KH-20 by Asahi Glass Co., Ltd.
Solvent A: propylene glycol methyl ether acetate
Solvent B: ethyl lactate The resist composition thus prepared was filtered through a nylon resin filter having a pore size of 0.04 μm and spin coated on a mask blank substrate to form a coating of 0.24 μm thick. The mask blank was baked on a hot plate at 90° C. for 10 minutes, irradiated by means of an EB direct writing system HL-800D (Hitachi High-Technologies Corp.) at an accelerating voltage of 50 keV, post-exposure baked (PEB) at 110° C. for 10 minutes, and developed with an aqueous solution of 2.38% tetramethylammonium hydroxide, yielding a positive pattern (Examples 1 to 6, Comparative Examples 1 to 3).

The resist pattern was evaluated as follows. The exposure dose which provided a 1:1 resolution between top and bottom of a 0.20 μm line-and-space pattern is an optimum exposure dose (sensitivity, Eop). The minimum line width of a line-and-space pattern which remained separated at the optimum exposure dose is the resolution of a test resist. The profile of a resist pattern as resolved was evaluated by observing a resist cross section under a SEM.

The dry etching resistance of a resist material after development was examined by actually etching on a dry etching instrument TE-8500S by Tokyo Electron Ltd., observing a resist cross section under a SEM. A thickness reduction of resist film by etching is expressed in relative value provided that a thickness reduction of resist film of Comparative Example 1 is 1.0. Smaller values indicate that resist materials have better etching resistance. A set of etching conditions is shown below.

| Chamber pressure: | | 40.0 Pa |
|---|---|---|
| RF power: | | 800 W |
| Gas: | $CHF_3$ | 20 ml/min |
| | $CF_4$ | 20 ml/min |
| | Ar | 400 ml/min |
| Time: | | 2.5 min |

The test results of resists are shown in Table 2.

TABLE 2

| | Resolution (μm) | Profile | Etching resistance (film thickness reduction) |
|---|---|---|---|
| Example 1 | 0.07 | Rectangular | 0.93 |
| Example 2 | 0.07 | Rectangular | 0.92 |

TABLE 1

| Composition (pbw) | Example | | | | | | Comparative Example | | |
|---|---|---|---|---|---|---|---|---|---|
| | 1 | 2 | 3 | 4 | 5 | 6 | 1 | 2 | 3 |
| polymer 1 | — | — | — | — | 80 | — | — | — | — |
| polymer 2 | 80 | 80 | 80 | 80 | — | — | 80 | 80 | 80 |
| polymer 3 | — | — | — | — | — | 80 | — | — | — |
| PAG-1 | 6 | 6 | 6 | 6 | 6 | 6 | 6 | 6 | 6 |
| PAG-2 | 2 | 2 | 2 | 2 | 2 | 2 | 2 | 2 | 2 |
| Quencher 1 | 0.2 | — | — | 0.1 | 0.2 | 0.2 | — | — | — |
| Quencher 2 | — | 0.2 | — | — | — | — | — | — | — |
| Quencher 3 | — | — | 0.22 | — | — | — | — | — | — |
| Quencher 4 | — | — | — | 0.1 | — | — | 0.2 | — | — |
| Quencher 5 | — | — | — | — | — | — | — | 0.2 | — |
| Quencher 6 | — | — | — | — | — | — | — | — | 0.2 |
| Surfactant A | 0.07 | 0.07 | 0.07 | 0.07 | 0.07 | 0.07 | 0.07 | 0.07 | 0.07 |
| Solvent A | 470 | 470 | 470 | 470 | 470 | 470 | 470 | 470 | 470 |
| Solvent B | 1,100 | 1,100 | 1,100 | 1,100 | 1,100 | 1,100 | 1,100 | 1,100 | 1,100 |

TABLE 2-continued

| | Resolution (μm) | Profile | Etching resistance (film thickness reduction) |
|---|---|---|---|
| Example 3 | 0.08 | Rectangular | 0.92 |
| Example 4 | 0.09 | Somewhat bulged top | 0.93 |
| Example 5 | 0.06 | Rounded top | 1.14 |
| Example 6 | 0.08 | Rectangular | 0.77 |
| Comparative Example 1 | 0.11 | Pattern collapse | 1.0 |
| Comparative Example 2 | 0.12 | Pattern collapse | 1.01 |
| Comparative Example 3 | 0.13 | Pattern collapse | 0.98 |

Japanese Patent Application No. 2006-285753 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A chemically amplified positive resist composition comprising (A) a compound having an amine oxide structure as a basic component, (B) an organic solvent, (C) a base resin having an acid labile group-protected acidic functional group which is alkali-insoluble or substantially alkali-insoluble, but becomes alkali-soluble when the acid labile group is eliminated, and (D) a photoacid generator, wherein the compound having an amine oxide structure is selected from the group consisting of compounds represented by the general formula (2), (3) or (4):

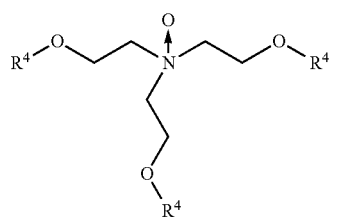

(2)

wherein $R^4$ is selected from the group consisting of hydrogen, straight, branched or cyclic $C_1$-$C_{20}$ alkyl, $C_6$-$C_{20}$ aryl, $C_7$-$C_{20}$ aralkyl, $C_2$-$C_{10}$ alkoxyalkyl, $C_1$-$C_{10}$ hydroxyalkyl, and $C_2$-$C_{10}$ acyloxyalkyl groups,

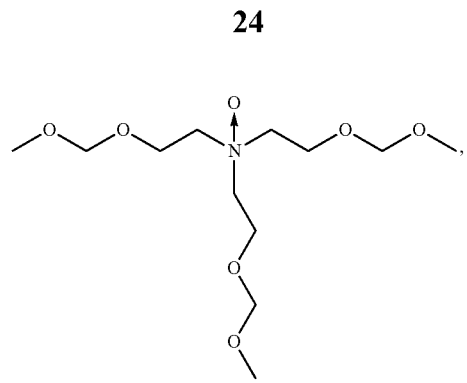

(3)

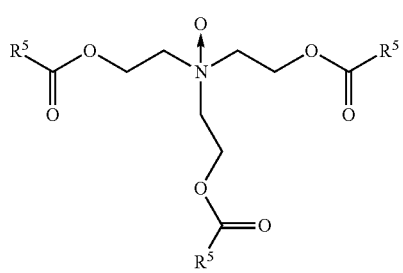

(4)

wherein $R^5$ is hydrogen, straight, branched or cyclic $C_1$-$C_{20}$ alkyl, $C_6$-$C_{20}$ aryl, or $C_7$-$C_{20}$ aralkyl group, as a basic compound.

2. A patterning process comprising the steps of:

applying the resist composition of claim 1 onto a substrate or mask blank substrate to form a coating;

heat treating the coating, then exposing it to high energy radiation, EUV or electron beam through a photomask; and optionally heat treating the exposed coating, then developing with a developer.

3. A patterning process comprising the steps of:

applying a resist composition onto a substrate or mask blank substrate to form a coating;

heat treating the coating, then exposing it to high-energy radiation, EUV or electron beam through a photomask; and optionally heat treating the exposed coating, then developing with a developer, wherein said resist composition comprises (A) at least one compound having an amine oxide structure selected from the group consisting of compounds represented by the general formula (2), (3) or (4):

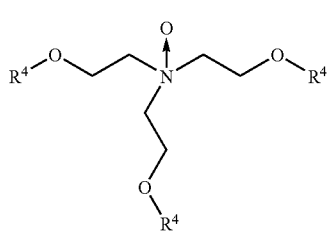

(2)

wherein $R^4$ is selected from the group consisting of hydrogen, straight, branched or cyclic $C_1$-$C_{20}$ alkyl, $C_6$-$C_{20}$ aryl, $C_7$-$C_{20}$ aralkyl, $C_2$-$C_{10}$ alkoxyalkyl, $C_1$-$C_{10}$ hydroxyalkyl, and $C_2$-$C_{10}$ acyloxyalkyl groups,
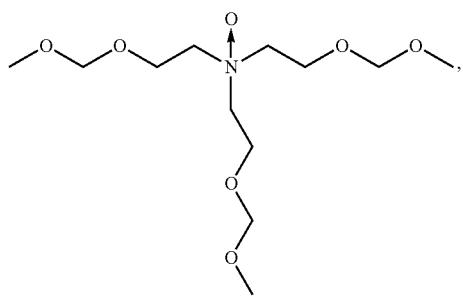
(3)
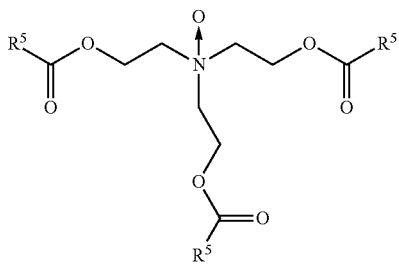
(4)
wherein $R^5$ is hydrogen, straight, branched or cyclic $C_1$-$C_{20}$ alkyl, $C_6$-$C_{20}$ aryl, or $C_7$-$C_{20}$ aralkyl group, as a basic compound.
* * * * *